United States Patent
Voigt et al.

(10) Patent No.: US 7,699,691 B1
(45) Date of Patent: Apr. 20, 2010

(54) COOLING SYSTEM AND METHOD FOR ENCLOSED VOLUME

(75) Inventors: Allan A. Voigt, Geyserville, CA (US); Keir John Batson, Santa Rosa, CA (US); Daryl Lee Schmidt, Cloverdale, CA (US)

(73) Assignee: L-3 Communications Sonoma EO, Inc., Santa Rosa, CA (US)

( * ) Notice: Subject to any disclaimer, the term of this patent is extended or adjusted under 35 U.S.C. 154(b) by 594 days.

(21) Appl. No.: 11/127,768

(22) Filed: May 11, 2005

(51) Int. Cl.
*H05K 7/20* (2006.01)
*H05K 5/00* (2006.01)

(52) U.S. Cl. .................. 454/184; 361/690; 361/695; 361/696; 348/151; 165/104.33

(58) Field of Classification Search .............. 454/184; 348/151; 361/696, 690, 695; 165/104.33
See application file for complete search history.

(56) References Cited

U.S. PATENT DOCUMENTS

| | | | | | |
|---|---|---|---|---|---|
| 3,732,368 | A | * | 5/1973 | Mahlab | 348/151 |
| 4,320,949 | A | * | 3/1982 | Pagano | 396/427 |
| 4,701,833 | A | * | 10/1987 | Bornhorst | 362/294 |
| 4,796,039 | A | * | 1/1989 | Pagano | 396/427 |
| 4,920,367 | A | * | 4/1990 | Pagano | 396/427 |
| 4,949,218 | A | * | 8/1990 | Blanchard et al. | 361/696 |
| 4,984,089 | A | * | 1/1991 | Stiepel et al. | 348/143 |
| 5,153,623 | A | * | 10/1992 | Bouvier | 396/427 |
| 5,394,184 | A | * | 2/1995 | Anderson et al. | 348/151 |
| 5,689,304 | A | * | 11/1997 | Jones et al. | 348/373 |
| 5,758,955 | A | * | 6/1998 | Belliveau | 362/293 |
| 6,061,087 | A | * | 5/2000 | Schieltz et al. | 348/151 |
| 6,113,485 | A | * | 9/2000 | Marquis et al. | 454/184 |
| 6,148,907 | A | * | 11/2000 | Cheng | 165/121 |
| 6,454,229 | B1 | * | 9/2002 | Voigt et al. | 248/182.1 |
| 7,234,510 | B1 | * | 6/2007 | Gilevich | 165/47 |
| 2001/0022627 | A1 | * | 9/2001 | Bernhardt | 348/373 |
| 2001/0052412 | A1 | * | 12/2001 | Tikka | 165/299 |

* cited by examiner

*Primary Examiner*—Steven B McCallister
*Assistant Examiner*—Patrick F. O'Reilly, III
(74) *Attorney, Agent, or Firm*—Pillsbury Winthrop Shaw Pittman LLP

(57) ABSTRACT

A cooling system is provided for enclosed volumes having payloads of electronic or other equipment that are susceptible to failures when overheated. One particularly useful application of the present invention is in a cooling system for a turreted gimbaled system (i.e. a gimbal) that includes electronic and optical equipment typically used for surveillance, but many other applications will become apparent to those skilled in the art after being taught by the present disclosure. According to one aspect of the invention, a cooling system includes a pair of reciprocal openings between a gimbal sphere and yoke allowing for passage of air therethrough and a pair of fans for circulating the air between the sphere and yoke, thereby expanding the surface area available for heated air from the interior to conduct into the exterior air. In another example, a heat exchanger is provided in the yoke to allow further cooling of the circulated air. In another example, a heat pipe is provided in the yoke to allow heat to be transferred to the heat exchanger.

15 Claims, 9 Drawing Sheets

COOLING SYSTEM AND METHOD FOR ENCLOSED VOLUME

FIELD OF THE INVENTION

The present invention relates generally to cooling systems, and in particular to a system for cooling enclosed volumes containing payloads such as electronics and sensor equipment.

BACKGROUND OF THE INVENTION

It is well known that heat can be a problem, and that overheating can lead to failures of components such as electronics. This is particularly true with enclosed, largely airtight payloads filled with electronics and other gear.

As shown in FIG. 1, enclosed volume 100 is bounded by a shell that has an exterior skin 108 and interior skin 106. Within the enclosed volume is a hot spot 102 and interior air 104. Conventional cooling techniques typically rely on air transfer (e.g. fans) to cool down hot spots. But air is a poor transfer medium, and such cooling techniques are sometimes insufficient. Meanwhile, if the enclosed volume 100 is in an environment (e.g. airborne at high altitudes) where the exterior air 110 is much colder than the interior air, the much colder exterior air 110 could be used to cool down the hot spot. This however, requires an efficient means of transferring heat from hot spot 102 to interior air 104 to interior skin 106 to exterior skin 108 to exterior air 110.

One particular problem in this transfer is that interior air 104 is a poor heat conductor. Rather than directing heat from hot spot 102 efficiently to the interior skin 106, where it can be then transferred to exterior air 110, heat tends to disperse throughout all available interior air 104. Not only does this lead to unreliable cooling of the hot spot, but the interior air 104 also heats up, further leading to its inability to provide cooling to the hot spot 102 and other components in the interior of the enclosed volume.

Accordingly, it would be desirable if there was a system for more reliably cooling the interior of an enclosed volume, including the cooling of hot spots in the volume such as electronics equipment.

SUMMARY OF THE INVENTION

The present invention relates to cooling systems, and more particularly relates to cooling systems for enclosed volumes having payloads of electronic or other equipment that are susceptible to failures when overheated. One particularly useful application of the present invention is in a cooling system for a turreted gimbaled system (i.e. a gimbal) that includes electronic and optical equipment typically used for surveillance, but many other applications will become apparent to those skilled in the art after being taught by the present disclosure. According to one aspect of the invention, a cooling system includes a pair of reciprocal openings between a gimbal sphere and yoke allowing for passage of air therethrough and a pair of fans for circulating the air between the sphere and yoke, thereby expanding the surface area available for heated air from the interior to conduct into the exterior air. In another example, a heat exchanger is provided in the yoke to allow further cooling of the circulated air. In another example, a heat pipe is provided in the yoke to allow heat to be transferred to the heat exchanger. According to another aspect of the invention, focused cooling is provided for a hot spot in an enclosed volume. According to one example, the focused cooling is provided by mounting a fan on or near the hot spot and directing a stream of air to the interior skin of the enclosed volume. A heat sink may be provided on the skin in the direction of the focused exhaust and/or a heat sink is provided between the hot spot and the fan. According to another example, a fan is provided along with a heat sink on the interior skin of the enclosed volume, and exhaust is directed toward the hot spot, which may further include its own heat sink. According to a further example, a heat pipe is provided between the hot spot and a fan, whose exhaust is directed toward the interior skin. The above aspects of the invention may be provided in combination or separately.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
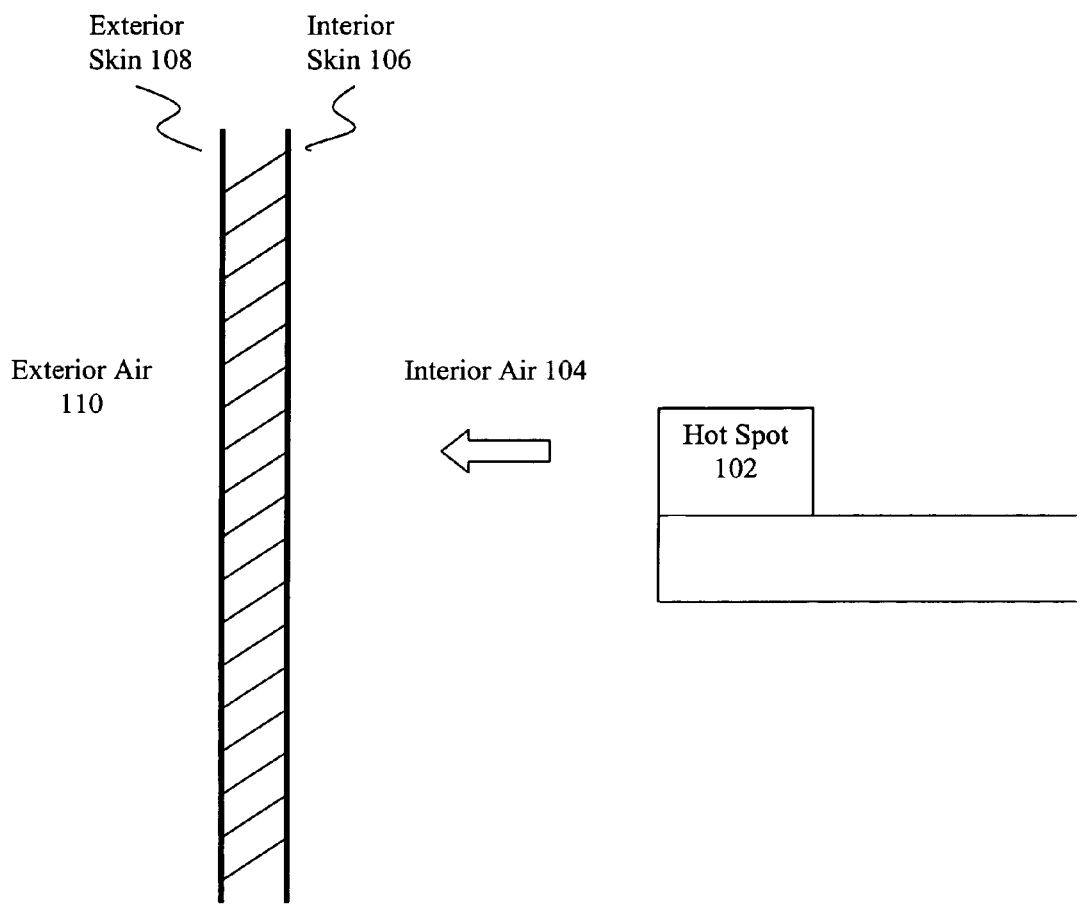
FIG. 1 illustrates problems in conventional enclosed volume cooling systems.
Figure 2:
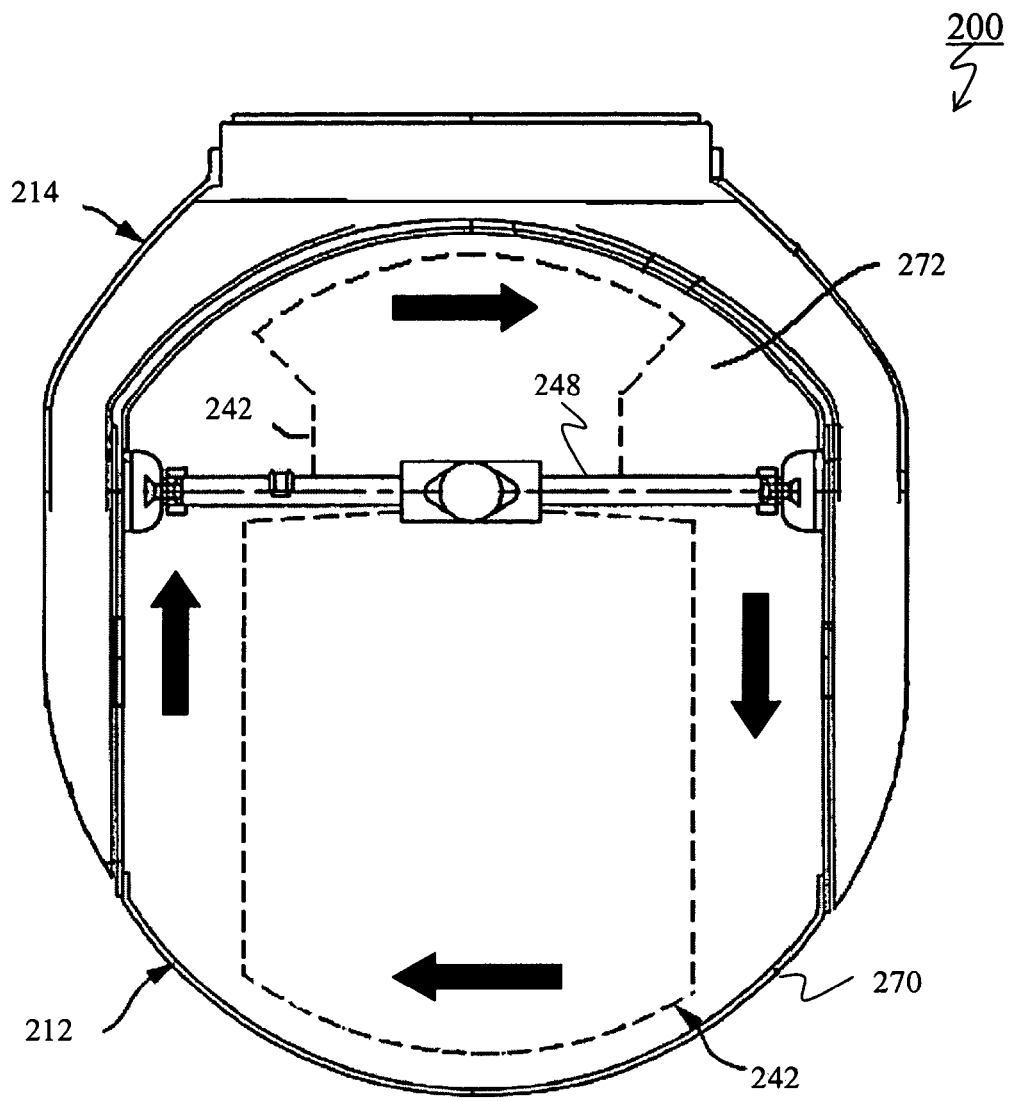
FIG. 2 illustrates conventional cooling techniques in an example application of a gimbal.

FIG. 2 illustrates conventional approaches to cooling systems for an example enclosed volume being a gimbal, identified in general by the reference numeral 200, such as a gimbal as described in more detail in U.S. Pat. No. 6,454,229, commonly owned by the present assignee, the contents of which are incorporated herein by reference.

Generally, gimbal 200 compensates for movement by a vehicle (not shown) to which the gimbal 200 is mounted, such as, for example, any land, sea, or air type of a vehicle. The gimbal 200 maintains alignment of a sensor (or sensors) that it carries with an object of interest while the vehicle moves. This is accomplished by proportionately controlling the various axes so as to move the sensors in response to detected movement that is experienced by the vehicle.

The gimbal 200 may be of any desired size. It includes a gimbal sphere 212 which has a shell 270 that encloses an interior volume 272. The sphere 212 is supported by an outer axis support structure 214, which is sometimes referred to as a "yoke". In one example, the interior volume 272 is approximately 0.2 (cubic meters), and shell 270 is comprised of carbon fiber/epoxy or aluminum or similar material and is approximately 2 mm thick. It should be noted that shell 270 may not be completely opaque and surrounding interior volume 272, such as when the sphere 212 further includes a window through which optical sensors and the like receive optical images, in which case a window may be integrally formed in shell 270. Yoke 214 is comprised of 3 mm thick aluminum, for example.

Dotted lines 242 indicate the available volume for payloads within the sphere 212. This available volume can include a vibration clearance around the payload to prevent any part of the payload from contacting the inside of the sphere 212. Generally, the volume within lines 242 below the shaft 248 will include sensors such as cameras and the like, while the volume above the shaft 248 within lines 242 will include gyroscopes and electronics packages to control motors (not shown) that will provide adjustments of the payload, and thus the alignment of the sensors with respect to an object of interest.

The entire volume within sphere 212 is fairly airtight and is dry and desiccated. Meanwhile, certain components in the payload within sphere 212 are capable of generating significant heat, such as electronic components. Conventionally, fans (not shown) are provided within the sphere 212 and circulate air within the sphere 212. However, as the payload becomes more packed with electronic components, the conventional approach becomes less sufficient.

One aspect of the present invention provides a means of cooling the interior of sphere 212, including but not limited to hot spots (e.g. certain components) in the payload. It should be noted that although the present invention finds useful application in enclosed volumes such as gimbal 200, the present invention is not limited to this particular application. Furthermore, although fairly distinct aspects of the invention will be described in more detail below, these aspects can be practiced either separately or in combination together, whether for the illustrative gimbal application or other enclosed volume applications.

In general, a first aspect of the invention provides a means for effectively expanding the surface area of the shell of the enclosed volume, thus providing a means for reducing the temperature of the air within the enclosed volume by allowing for greater heat transfer from the interior to the exterior air through the surface area.

Figure 3A:
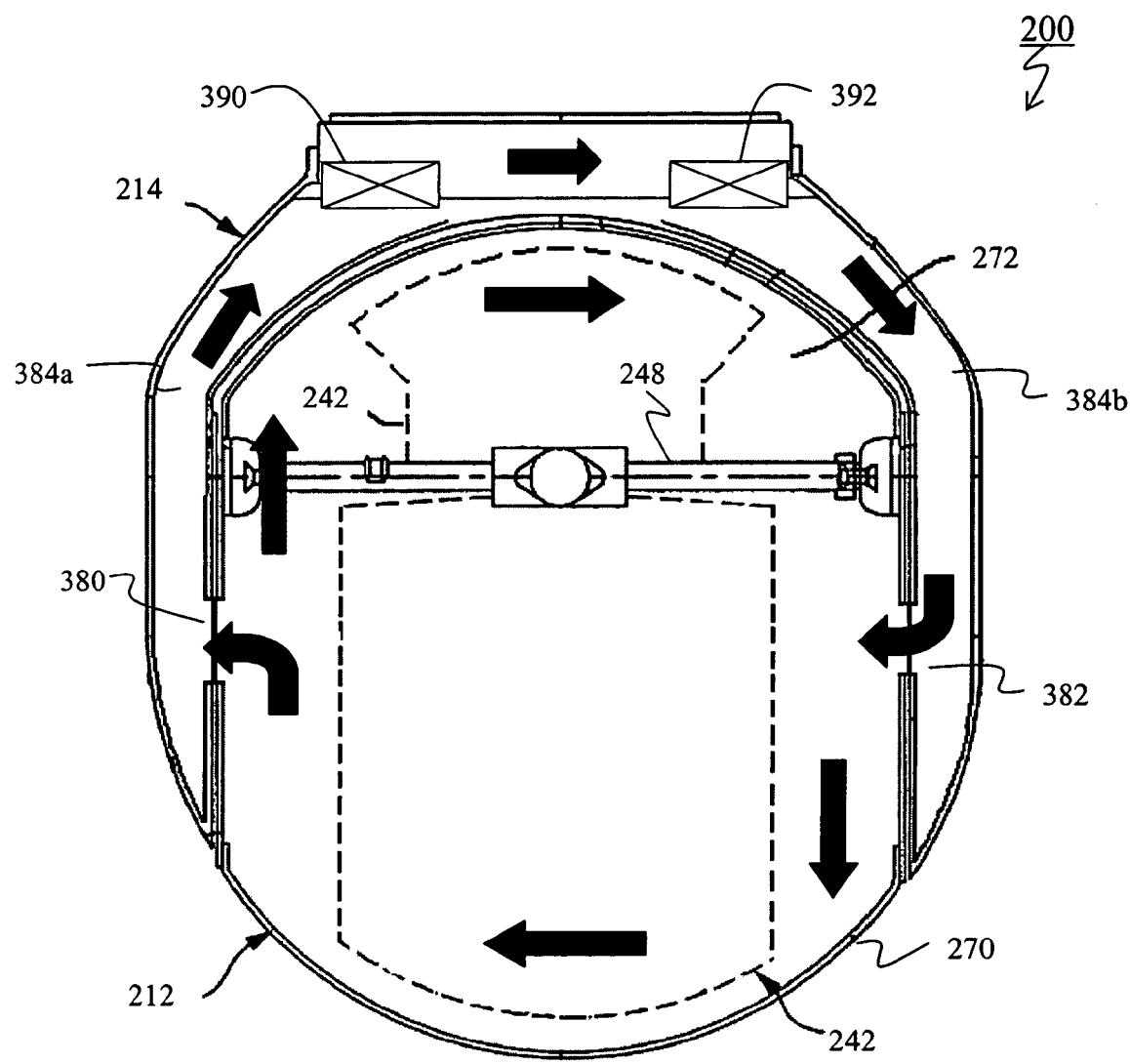
FIG. 3A illustrates a first example implementation in a gimbal of a cooling system according to a first aspect of the invention.

As shown in FIG. 3A, in a first embodiment according to the first aspect of the invention, "pull" fan 390 and "push" fan 392 are provided in yoke 214, in addition to reciprocating holes 380 and 382 that are provided in both the shell 270 and the yoke 214. These additional features permit the flow of air between the interior volume 272 of the sphere 212 and the interior volume 384 of the yoke 214. As shown in FIG. 3A, in this example, air from the interior volume 272 of sphere 212 is drawn through reciprocal first holes 380 in the yoke 214 and in the shell of sphere 212 and into the interior volume 384a of yoke 214 by fan 390. Fan 392 causes air to be further circulated into interior volume 384b of yoke 214. The exhausted air then flows into second reciprocating holes 382, and thus back into interior volume 272 of sphere 212. As further shown in FIG. 3A, the flow of air between the interior volumes 272 and 384 of the sphere 212 and yoke 214, respectively, allows air to circulate over hot spots in the payload areas outlined by dotted lines 242 in both the upper and lower portions of sphere 212.

As set forth above, yoke 214 includes first hole 380 and second hole 382 that align with similar holes 380 and 382 in shell 270. In one example, first hole 380 is about 1.7 inches in diameter, while second hole 382 is about 1.9 inches in diameter. In this example, where fan 390 is a "pull" fan, and fan 392 is a "push" fan, air is drawn through first hole 380 into the interior volume 384a by fan 390. In one example, interior volume 384a is a channel formed in yoke 214 having a circumference of about 4 sq. in. and about 12 in. long. Similarly, fan 392 exhausts air into interior volume 384b which, for example, is a channel formed in yoke 214 also having a cross sectional area of about 4 sq. in. and about 12 in. long. In one example of the invention, fans 390 and 392 are small tube-axial or vaneaxial fans used commonly in the aerospace and commercial industries. Although fans 390 and 392 are shown as being placed at the top (i.e. the portion of the gimbal that is adjacent the vehicle to which the gimbal is mounted) of the yoke 214 opposite the channels 384a and 384b from the holes 380 and 382, respectively, (i.e. the "top" is the portion of the gimbal that is adjacent the vehicle to which the gimbal is mounted) the fan placement is not limited to this example, and the particular fan placement can be made based on the air flow properties for an individual application. Generally, the placement of fans 390 and 392 is chosen so as to maximize the heat transfer resulting from circulating air into the yoke 214 and thus into the exterior air.

Figure 3B:
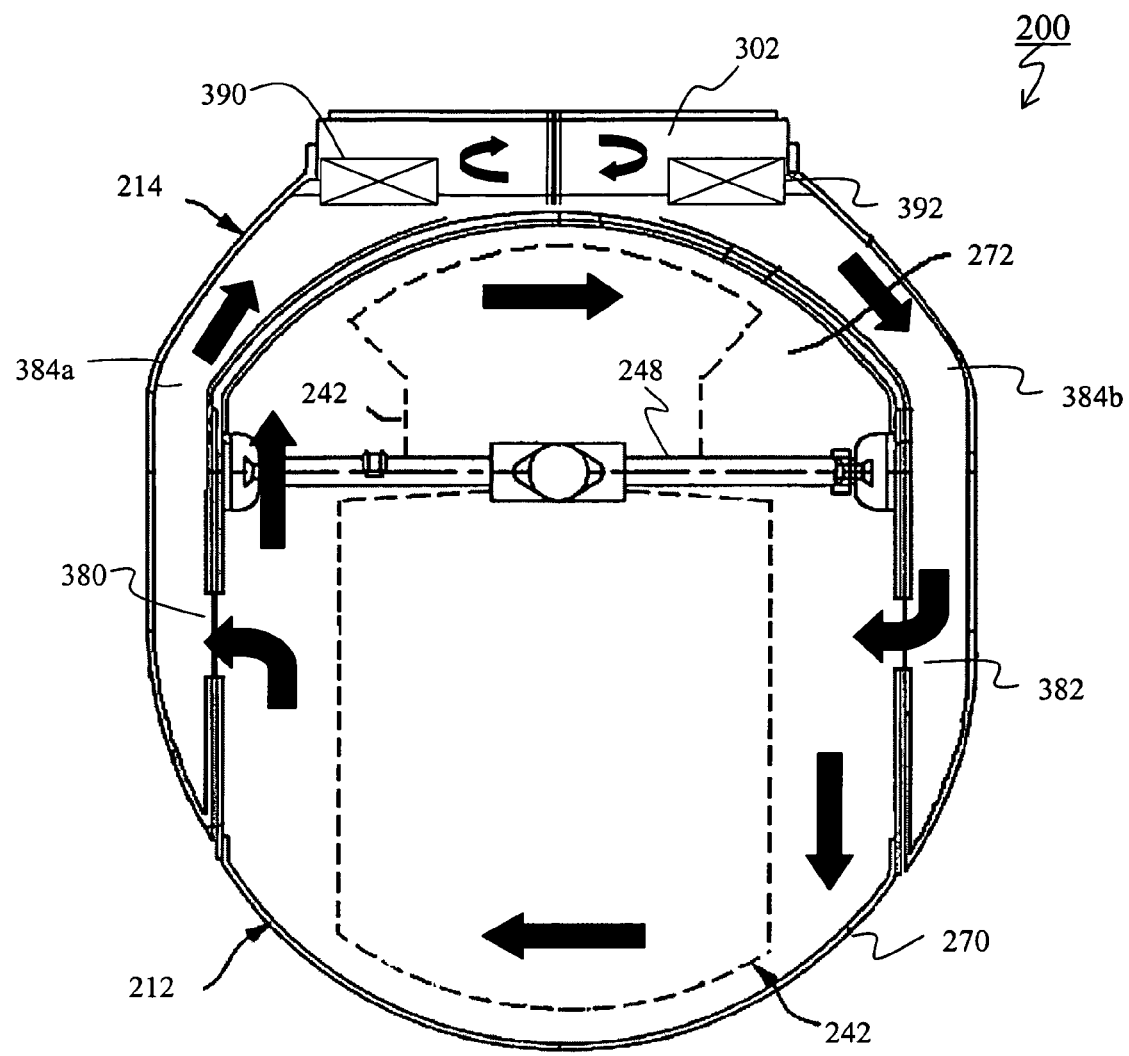
FIG. 3B illustrates a second example implementation in a gimbal of a cooling system according to a first aspect of the invention.

Referring now to FIG. 3B, in a second embodiment according to the first aspect of the invention, heat exchange area 302 is further provided in the top of yoke 214. As shown in FIG. 3B, in this example, fan 390 further draws warm air from yoke interior volume 384a into exchanger area 302. Air circulates within exchange area 302 by action of fan 390 and "push" fan 392, allowing heat to be transferred through the shell of the top of the yoke 214 and into the exterior air. Fan 392 causes cooled air from exchanger 302 to be exhausted into interior volume 384b of yoke 214. The exhausted air then flows into second reciprocating holes 382, and thus back into interior volume 272 of sphere 212.

In one example of the invention, exchanger 302 is, in combination with the arrangement of fans 390 and 392, a hollow area formed within the top of yoke 214 and has a volume of approximately 200 in.$^3$ The volume of the heat exchanger 302 can further include fins or other features (not shown) to allow for improved conduction of heat to the shell of the yoke 214 and thus to the exterior air. Whether or not exchanger 302 includes these features, the volume of exchanger 302 increases the surface area that the circulating air comes into contact with. Increasing the surface area improves the heat transfer from the internal air to the external air. The surface area inside the heat exchanger volume 302 can be a 50% or larger percentage increase of the total internal surface area without the cooling system in this embodiment according to the first aspect of the present invention.

Figure 3C:
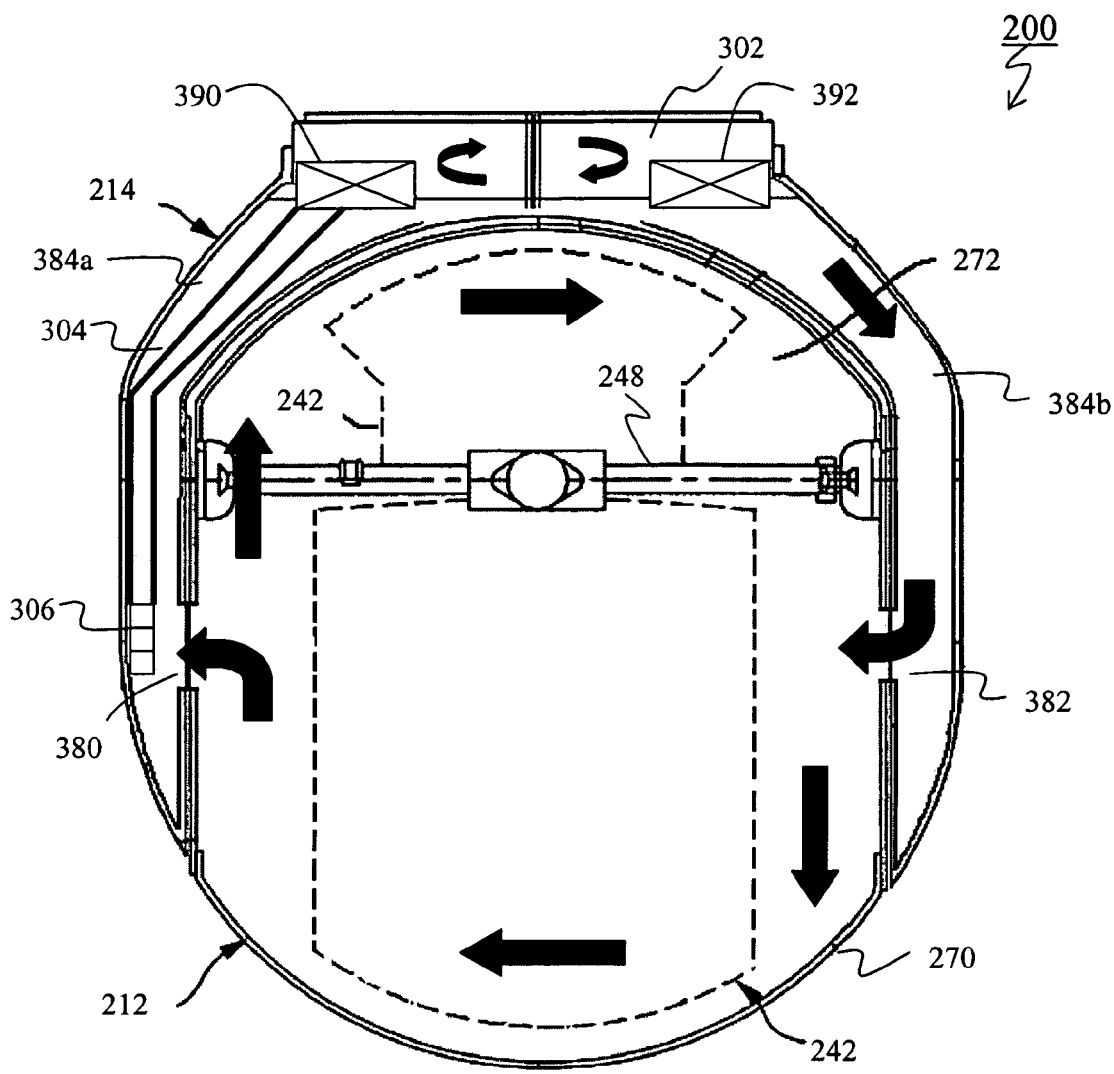
FIG. 3C illustrates a third example implementation in a gimbal of a cooling system according to a first aspect of the invention.

Referring now to FIG. 3C, in a third embodiment according to the first aspect of the invention, yoke 214 includes one or more heat pipe structures to help move heat up from the yoke/sphere holes 380 to the heat exchanger 302, which improves overall heat transfer and/or reduces the yoke cross-section. More particularly, as shown in FIG. 3C, yoke 214 includes heat pipe 304 and heat sink 306 which is adjacent to yoke/sphere holes 380. The hot air drawn into yoke interior 384a through holes 380 impinges onto the heat sink 306 coupled to heat pipe 304, and the heat pipe 304 transfers heat to heat exchanger 302. Heat pipes are well known structures, such as those provided by Thermacore, Inc. of Lancaster, Pa., and so further details thereof will not be presented here so as not to obscure the present invention. Instead, publications and texts describing the construction and operation of heat pipes, such as R. DeHoff and K. Grubb, "Heat Pipe Application Guidelines," which can be downloaded from http://www.theremacore.com/pdfs/hpapp.pdf, are incorporated herein by reference. It should be noted that the number and placement of heat pipe structures can be optimized for a particular application, and so the invention is not limited to this described example.

Another aspect of the cooling system of the present invention will now be described in more detail in conjunction with the following figures.

Figure 4:
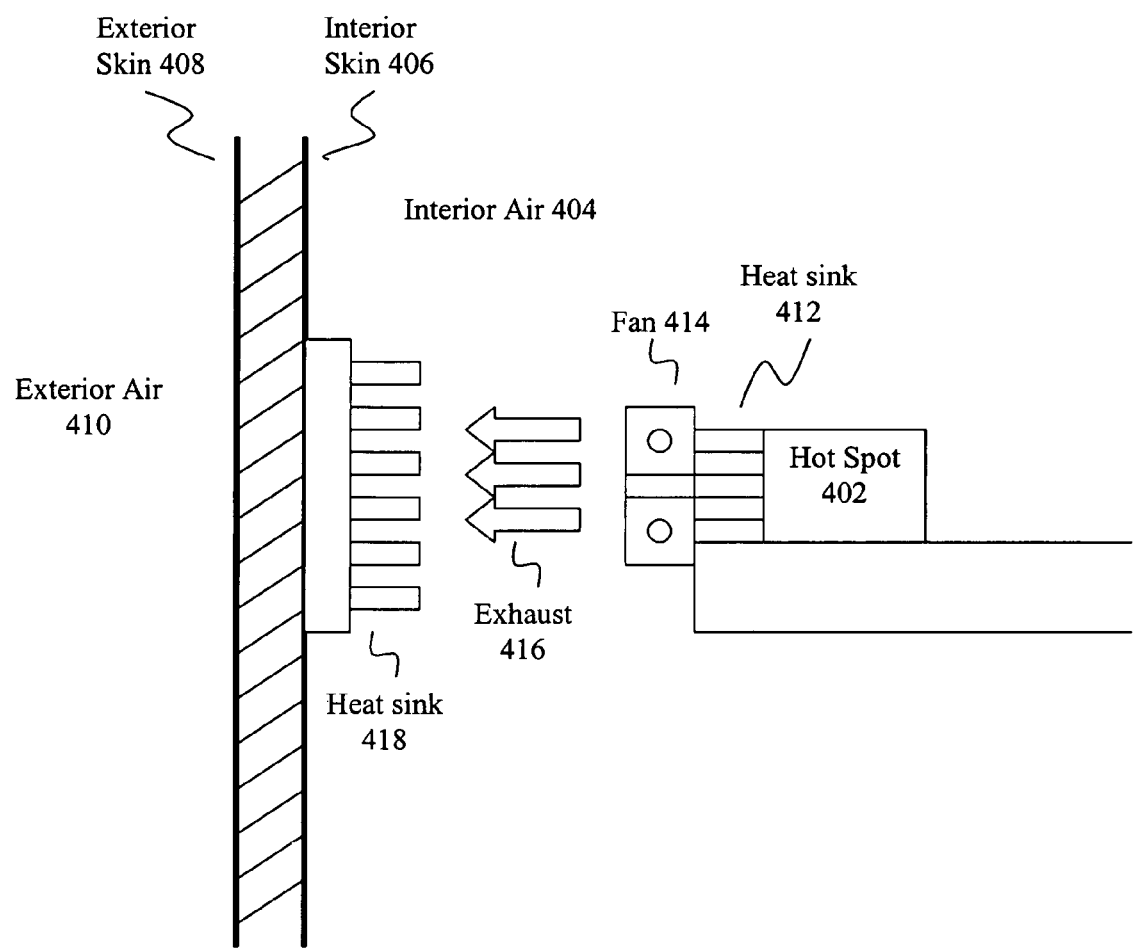
FIG. 4 illustrates a second aspect of a cooling system according to the invention.

As shown in FIG. 4, enclosed volume 400 (which can be, for example, a gimbal sphere such as sphere 212 described above) includes a hot spot 402 (which can be, for example, an electronic component in the payload portion of the gimbal sphere). Coupled to or mounted on or adjacent to hot spot 402 is a heat sink 412. Still further coupled to or mounted on or adjacent to the heat sink 412 is a fan 414. It should be noted that, alternatively, heat sink 412 need not be included. Fan 414 is, for example, a small tubeaxial or vaneaxial fan used commonly in the aerospace and commercial industries. Fan 414 has exhaust 416 directed to the interior skin 406 of shell of enclosed volume 400, such as, for example, shell 270. Although not necessary for the present invention, it is preferred that in the path of exhaust 416 on interior skin 406 there is mounted another heat sink 418. This allows heat from exhaust air 416 to be better conducted onto the shell and into the exterior air 410 due to the better heat transfer possible with the increase in surface area provided by the shell mounted heat sink 418.

Figure 5:
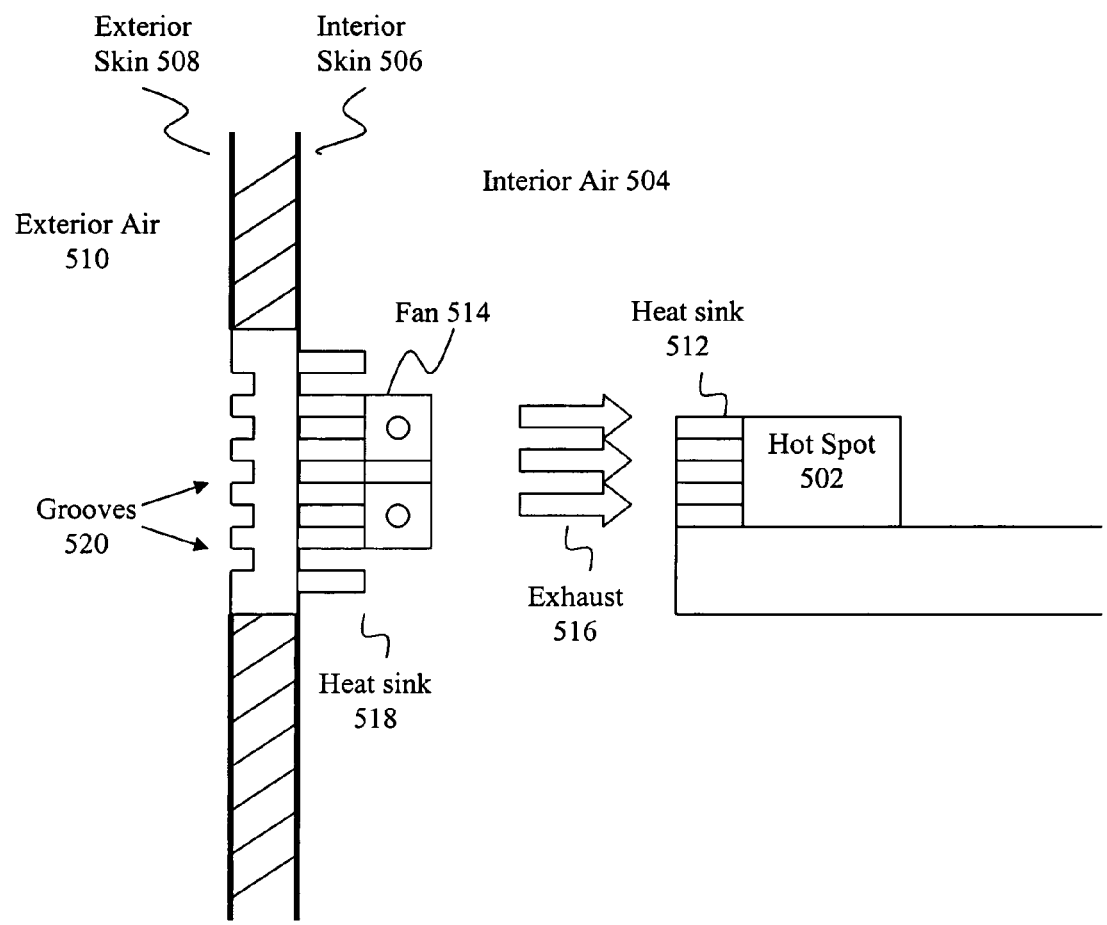
FIG. 5 illustrates an alternative of the second aspect of a cooling system according to the invention.

An alternative arrangement in keeping with this other aspect of the invention is illustrated in FIG. 5. As shown in FIG. 5, enclosed volume 500 (which can be, for example, a gimbal sphere such as sphere 212 described above) includes a hot spot 502 (which can be, for example, an electronic component in the payload portion of the gimbal sphere). Coupled to or mounted on or adjacent to hot spot 502 is a heat sink 512. It should be noted that, alternatively, heat sink 512 need not be included. As in the arrangement of FIG. 4, on interior skin 506 there is mounted another heat sink 518. Differently from the previous arrangement, however, coupled to or mounted on or adjacent to the heat sink 518 is a fan 514. Fan 514 is, for example, a small tubeaxial or vaneaxial fan used commonly in the aerospace and commercial industries. In this alternate arrangement, fan 514 has exhaust 516 directed toward the hot spot 502.

Other additional or alternative features in accordance with this other aspect of the invention are illustrated in FIG. 5. As shown in FIG. 5, heat sink 518 is integrally formed with the shell of enclosed volume 500. Still further, this structure can include grooves 520, or other heat transfer features such as pins, heat sinks, etc. It should be noted that the illustration of these grooves is not necessarily to scale. Rather, in one example implementation, they have a width of about 0.06 in. and a depth of about 0.20 in. The combination of the integral formation of heat sink 518 in the shell of enclosed volume 500, with the provision of grooves 520 allows for further cooling from exterior air 510 to hot spot 502 because of the increased heat transfer due to the increased surface area provided by the grooves 520.

As set forth more fully above, the two aspects of the present invention may be practiced separately or in combination with each other. Certain embodiments of a cooling system according to the invention will now be described in more detail in connection with some possible combinations.

Figure 6:
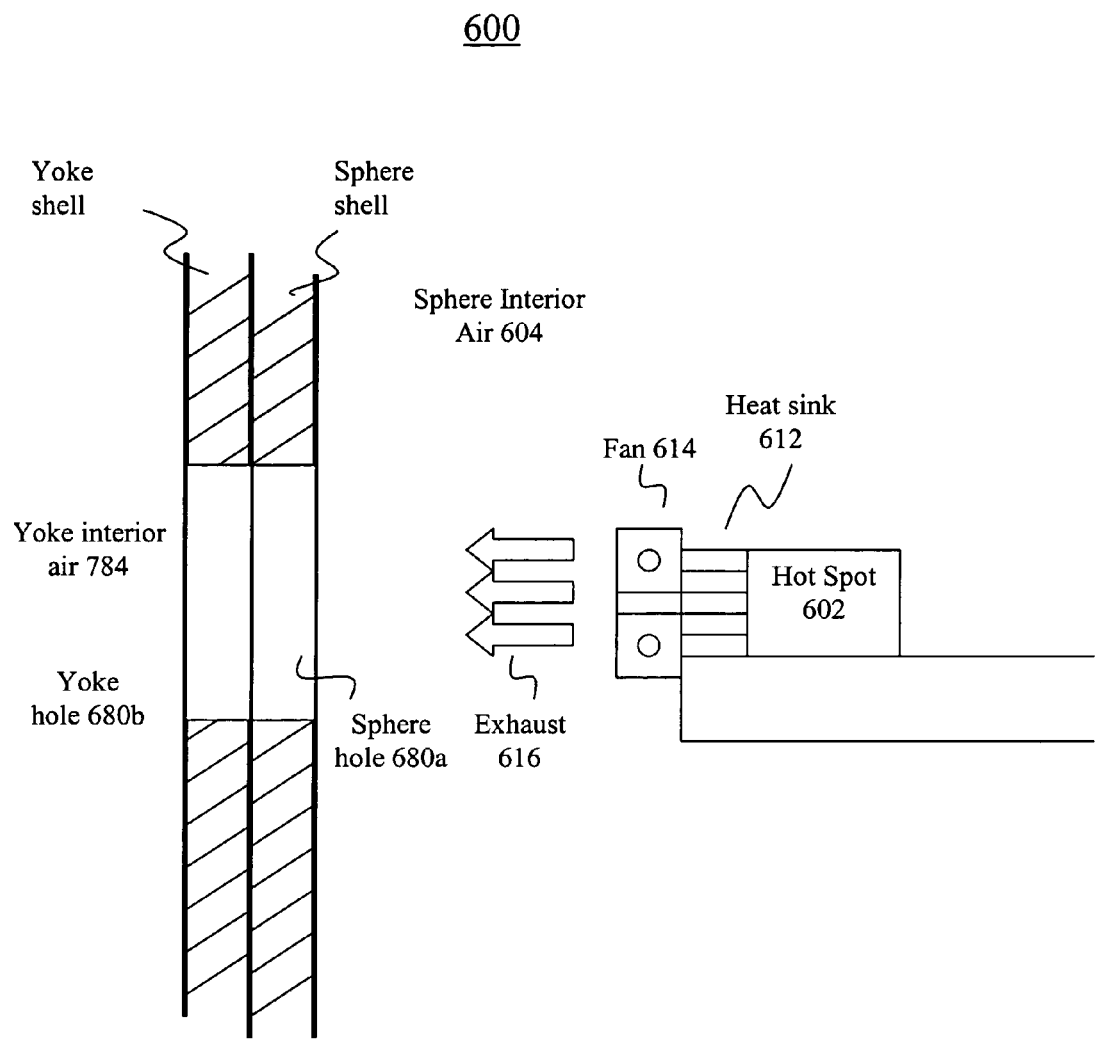
FIG. 6 illustrates a first example of combining the aspects of the cooling system according to the invention.

FIG. 6 illustrates a first embodiment of the combined aspects of the invention. In this embodiment, heat is exhausted from a hot spot to more directly facilitate transferring heat into the yoke.

More particularly, as shown in FIG. 6, enclosed volume 600 (which can be, for example, a gimbal sphere such as sphere 212 described above) includes a hot spot 602 (which can be, for example, an electronic component in the payload portion of the gimbal sphere). Coupled to or mounted on or adjacent to hot spot 602 is a heat sink 612. Still further coupled to or mounted on or adjacent to the heat sink 612 is a fan 614. It should be noted that, alternatively, heat sink 612 need not be included. Fan 614 is, for example, a small tubeaxial or vaneaxial fan used commonly in the aerospace and commercial industries. Fan 614 has exhaust 616 directed to the hole 680a in the shell of enclosed volume 600, such as, for example, shell 270. Reciprocal hole 680b, which can be, for example a hole in the shell of yoke 214 described above, allows exhaust air 616 to flow into the interior volume 784 of the yoke.

Figure 7:
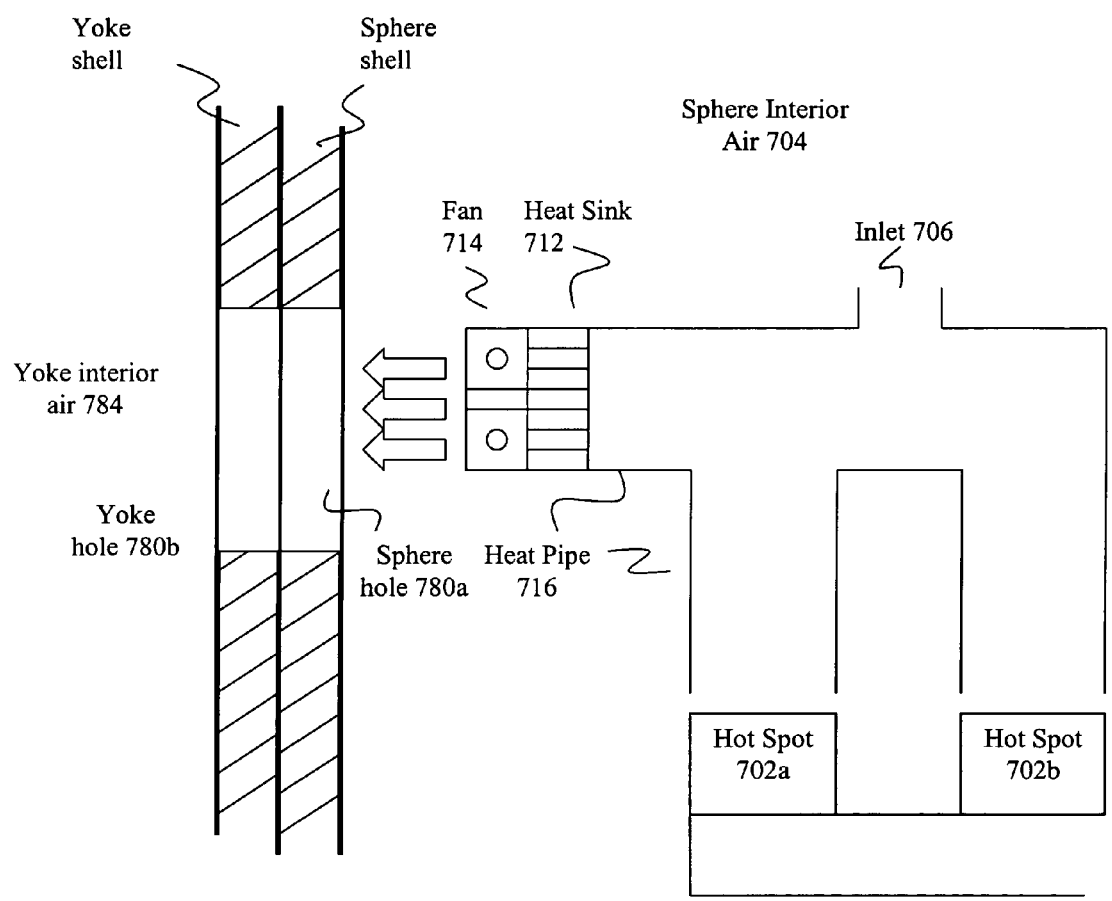
FIG. 7 illustrates a second example of combining the aspects of the cooling system according to the invention.

FIG. 7 illustrates a second embodiment of the combined aspects of the invention. This embodiment accounts for the possibility that some or all hot spots in an enclosed volume might not be conveniently located near a yoke/sphere hole (or sphere heat sink).

More particularly, as shown in FIG. 7, enclosed volume 700 (which can be, for example, a gimbal sphere such as sphere 212 described above) includes one or more hot spots 702a and 702b (which can be, for example, an electronic component in the payload portion of the gimbal sphere). Coupled to or mounted on or adjacent to hot spots 702a and 702b is a heat pipe 716. Heat pipe 716 is a conduit that has openings near or over hot spots 702a and 702b so as to gather heat emanating from these spots. Heat pipe 716 further includes an opening near hole 780a in the shell of enclosed volume 700, such as, for example, shell 270. Reciprocal hole 780b, which can be, for example a hole in the shell of yoke 214 described above, allows heat carried by heat pipe 716 to flow into the interior volume 784 of the yoke. In one example of the invention, heat pipe 716 is comprised of structures such as those provided by Thermacore, Inc. of Lancaster, Pa., though various other suppliers and structures are well known in the art.

It should be noted that instead of directing heat to a yoke/sphere hole, heat pipe 716 may direct heat to a heat sink, pins or other heat transfer structures formed on the interior of shell 270, for example. It should be further noted that heat pipe 716 may include opening 706 as shown in FIG. 7 so as to receive hot air from the interior of the enclosed volume.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A system for cooling an enclosed volume having a yoke portion and a sphere portion, the yoke portion and the sphere portion having yoke and sphere surface areas respectively exposed to exterior air, the system comprising:
   - a first hole in a shell of the sphere portion that aligns with and adjoins a second hole in the yoke portion;
   - a first channel formed in the yoke portion that is adapted to receive air from an interior of the sphere portion via the first and second holes; and
   - a first fan in the yoke portion that draws air from the interior of the sphere portion into the first channel,
   - wherein the enclosed volume is substantially airtight such that air is prevented from flowing either from the interior of the sphere portion to the exterior air or from the first channel to the exterior air, and wherein heat is transferred from a hot spot in the interior of the sphere portion to the yoke portion via a flow of the air through the first and second holes and the first channel, and
   - wherein the heat is further allowed to transfer to the exterior air via combined portions of both the yoke and sphere surface areas by conduction therethrough so as to more effectively cool the hot spot.

2. A system according to claim 1, further comprising:
   - a heat exchanger in the yoke portion in which air from the first channel is circulated.

3. A system according to claim 2, wherein the first fan further causes the air drawn into the first channel to circulate in the heat exchanger.

4. A system according to claim 2, wherein the enclosed volume comprises a gimbal.

5. A system according to claim 1, further comprising:
   - a third hole in the shell of the sphere portion that aligns with and adjoins a fourth hole in the yoke portion;
   - a second channel formed in the yoke portion that is adapted to provide a path for the air drawn into the first channel to flow into the sphere portion via the third and fourth holes; and
   - a second fan in the yoke portion that exhausts air into the second channel.

6. A system according to claim 5, wherein the first and second fans further cause air to circulate in the sphere portion.

7. A system according to claim 1, wherein the enclosed volume comprises a gimbal.

8. A system according to claim 1, further comprising a heat pipe that is provided in a portion of the first channel so as to receive air from the second hole.

9. A system according to claim 1, further comprising a second fan in the sphere portion that is disposed adjacent to the hot spot and has exhaust directed toward the first hole.

10. A system according to claim 1, further comprising:
    - a second fan in the sphere portion that has exhaust directed toward the first hole;
    - a heat pipe in the sphere portion disposed between the hot spot and the second fan.

11. A gimbal, comprising:
    - a gimbal sphere and a gimbal yoke, the gimbal yoke and sphere having yoke and sphere surface areas respectively exposed to exterior air;
    - a first hole in a shell of the gimbal sphere that aligns with and adjoins a second hole in the gimbal yoke;
    - a channel formed in the gimbal yoke that is adapted to receive air from an interior of the gimbal sphere via the first and second holes; and
    - a fan in the gimbal yoke that draws air from the interior of the gimbal sphere into the channel,
    - wherein the gimbal is substantially airtight such that air is prevented from flowing either from the interior of the gimbal sphere to the exterior air or from the channel to the exterior air, and wherein heat is transferred from a hot spot in the interior of the sphere portion to the yoke portion via a flow of the air through the first and second holes and the channel, and
    - wherein the heat is further allowed to transfer to the exterior air via combined portions of both the yoke and sphere surface areas by conduction therethrough so as to more effectively cool the hot spot.

12. A gimbal according to claim 11, further comprising:
    - a heat exchanger in the gimbal yoke in which air from the channel is circulated.

13. A gimbal according to claim 12, further comprising:
    - a third hole in the shell of the gimbal sphere that aligns with and adjoins a fourth hole in the gimbal yoke;
    - a second channel formed in the gimbal yoke that is adapted to provide a path for air to flow from the heat exchanger into the gimbal sphere via the third and fourth holes; and
    - a second fan in the gimbal yoke that exhausts air from the heat exchanger into the second channel.

14. A gimbal according to claim 13, wherein the first and second fans further cause air to circulate in the gimbal sphere.

15. A gimbal according to claim 12, wherein the first fan further causes air drawn into the channel to circulate in the heat exchanger.

* * * * *